US006123550A

United States Patent [19]

Burkert et al.

[11] Patent Number: 6,123,550

[45] Date of Patent: Sep. 26, 2000

[54] LINE PLUG CONNECTION

[75] Inventors: Manfred Burkert, Bockenem; Olaf Pentzek, Lügde; Bernd Leinwetter; Ulrich D. Becker, both of Hildesheim; Andreas Schwarte, Holle, all of Germany

[73] Assignee: Fuba Automotive GmbH & Co KG, Bad Salzdetfurth, Germany

[21] Appl. No.: 08/989,659

[22] Filed: Dec. 12, 1997

[30] Foreign Application Priority Data

| | | | |
|---|---|---|---|
| Dec. 13, 1996 | [DE] | Germany | 196 51 800 |
| Jan. 15, 1997 | [DE] | Germany | 197 01 034 |
| Aug. 8, 1997 | [DE] | Germany | 197 34 391 |

[51] Int. Cl.$^{7}$ .............................. H01R 12/00; H05K 1/00

[52] U.S. Cl. .............................................. 439/63; 439/581

[58] Field of Search ............................. 439/63, 580, 581, 439/578, 668, 59, 55

[56] References Cited

U.S. PATENT DOCUMENTS

| | | | |
|---|---|---|---|
| 2,926,340 | 2/1960 | Blain et al. . | |
| 2,980,878 | 4/1961 | Swengel | 439/55 |
| 3,112,145 | 11/1963 | Swengel | 439/55 |
| 3,426,317 | 2/1969 | Krol | 439/581 |
| 4,358,173 | 11/1982 | Conrad | 439/67 |
| 4,657,331 | 4/1987 | Coldren | 439/357 |
| 4,695,112 | 9/1987 | Maston et al. | 439/350 |
| 5,044,936 | 9/1991 | Kukkonen et al. | 439/63 |
| 5,059,131 | 10/1991 | Kukkonen et al. | 439/78 |
| 5,092,784 | 3/1992 | De Mendez et al. | 439/161 |
| 5,183,412 | 2/1993 | Nagafuji | 439/578 |
| 5,338,219 | 8/1994 | Hiramoto et al. | 439/350 |
| 5,387,119 | 2/1995 | Wood | 439/589 |
| 5,532,659 | 7/1996 | Dodart | 439/63 |
| 5,759,069 | 6/1998 | Kitatani et al. | 439/675 |

FOREIGN PATENT DOCUMENTS

| | | |
|---|---|---|
| 43 28 426 | 3/1994 | Germany . |
| 5-315721 | 2/1994 | Japan . |
| 7-015108 | 1/1995 | Japan . |
| 8-125296 | 5/1996 | Japan . |

*Primary Examiner*—Neil Abrams
*Assistant Examiner*—Hae Moon Hyeon
*Attorney, Agent, or Firm*—Collard & Roe, P.C.

[57] ABSTRACT

The invention is a line plug connector for transmitting electrical energy between a cable having a ground conductor and a center conductor, and printed circuit board. The cable end of plug connection is formed by a cable plug having an external conductive sleeve for connection to the ground conductor of the cable, and a center conductive sleeve for connection to the center conductor of the cable. The plug connects to least one elongated tab formed by a plurality of slots on a peripheral edge of the circuit board. In addition on the circuit board is a plurality of metal contacts formed over a portion of the circuit board adjacent to the slot openings. The connection is designed so that the spacing of the slots and the width of the tabs correspond with the width of the plug sleeves so that when the cable plug and its sleeves are pushed into the slots, the external sleeve is in frictional connection with at least one of the contacts on the circuit board, and the inner sleeve is connected to a different contact on the circuit board.

7 Claims, 9 Drawing Sheets

FIG. 3a
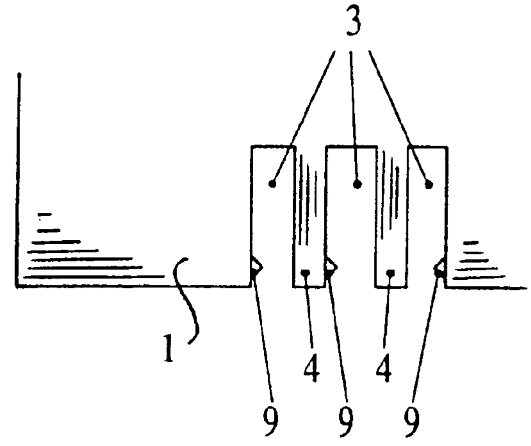
FIG. 3b
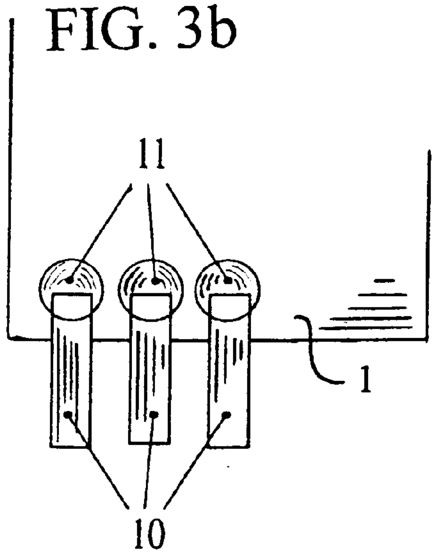
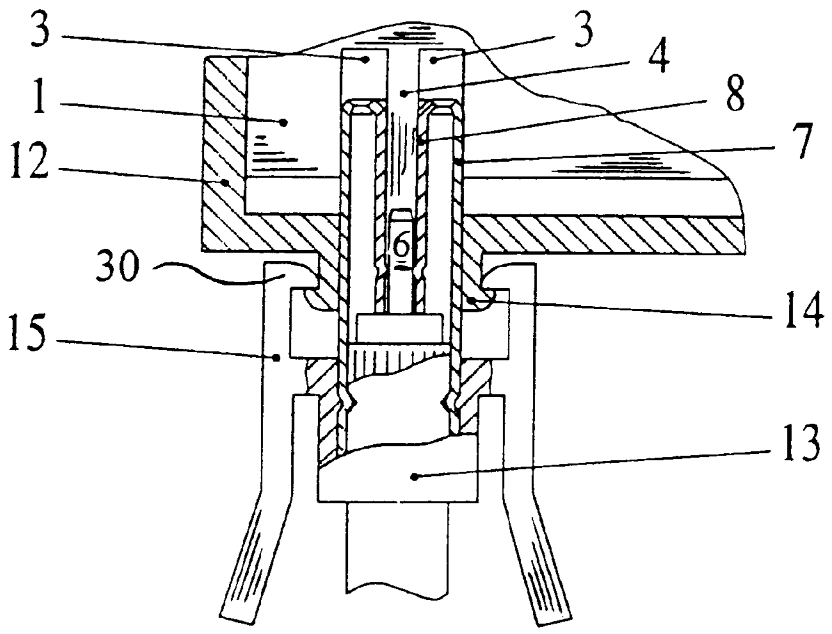
FIG. 4

FIG. 5
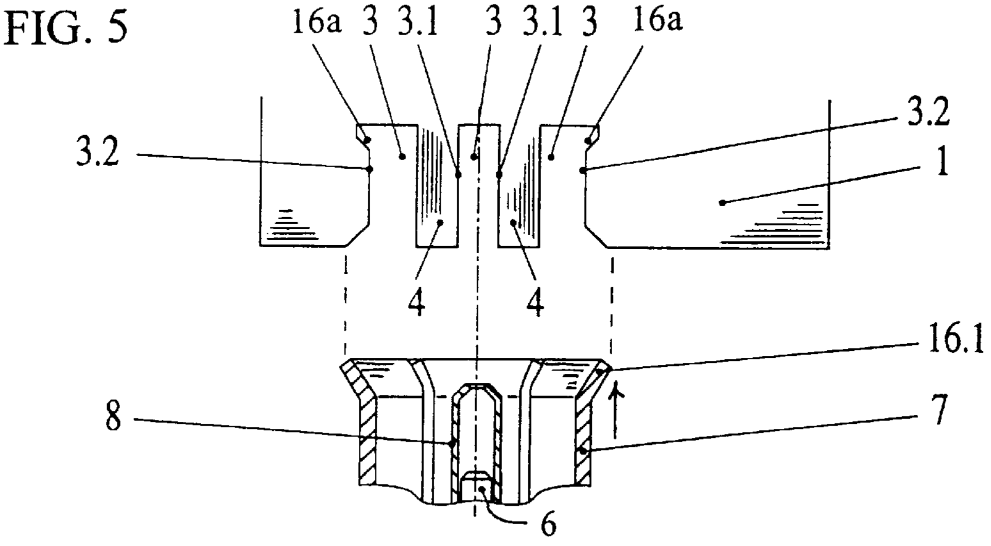
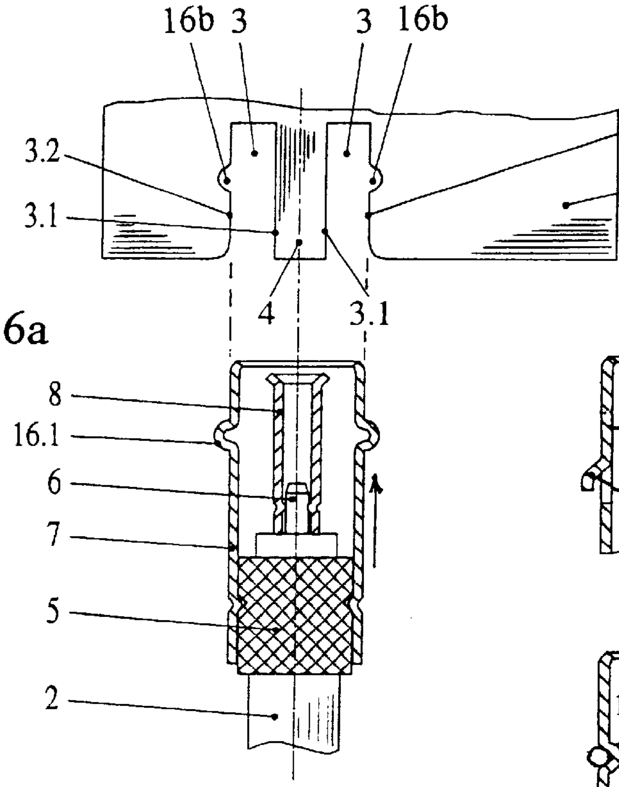
FIG. 6a
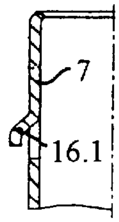
FIG. 6b
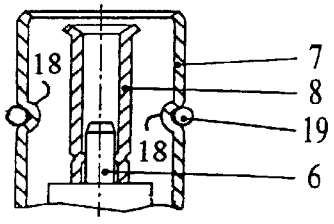
FIG. 6c

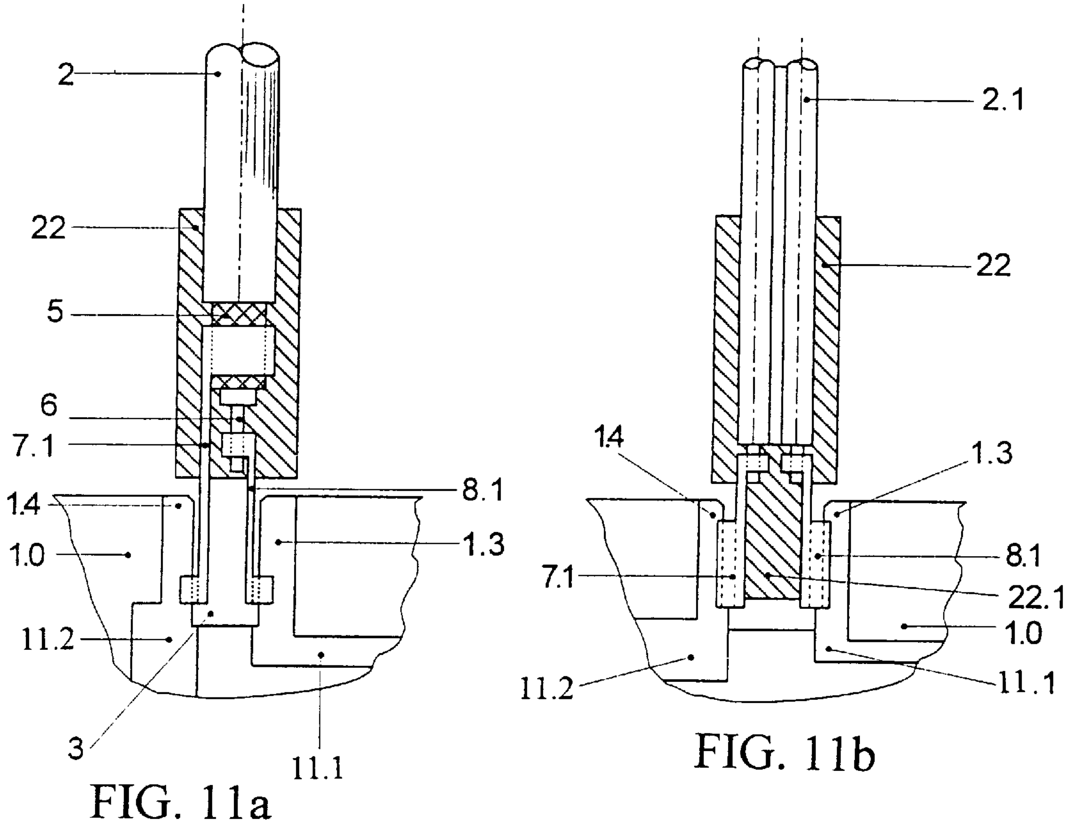
FIG. 11a
FIG. 11b
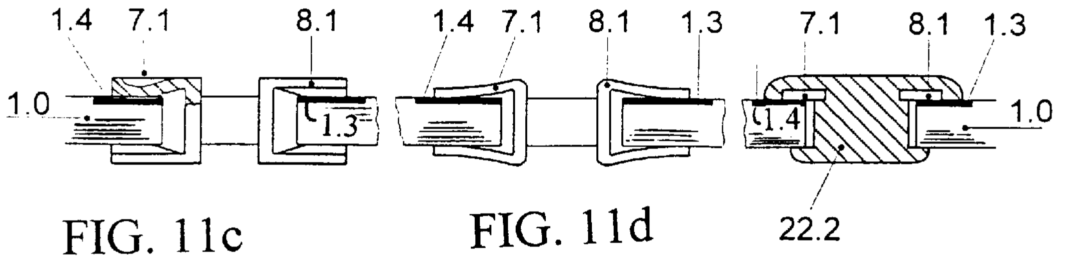
FIG. 11c
FIG. 11d
FIG. 11e

LINE PLUG CONNECTION

BACKGROUND OF THE INVENTION

1. Field of the Invention

The present invention relates to a line plug connection for the transmission of electric energy, especially for transmitting high-frequency signals.

2. The Prior Art

Flexible current paths arranged in pairs may comprise, coaxial cables, and two-conductor or multi-conductor symmetrical cables. Furthermore, this design requires a parallel connection of a number of cables, for example using a plug receptacle bar. PC boards with metal plated on one or both sides and also multi-layer arrangements normally serve as carrier material for fixed current paths, i.e., conducting paths. However, spatial embodiments are also possible, such as the concave inside surfaces of the housing of electric appliances (MID=molded interconnection devices).

In most cases, plugs are connected to a special bushing part or receptacle, which is fixed on the PC board, or in the wall of the housing, or directly integrated in the housing structure. The cable is fitted with a plug part that mates with the bushing part. For HF connections, the bushing and the plug each have their own central conductor piece for signal transmission. The center conductor part of the bushing is connected by soldering it to a conducting path, and also connecting the plug to the corresponding conductor of the cable.

The device can be grounded using the outside conductor parts of the plug and the bushing. In this case, the PC board is connected to the housing via soldered connections. The housing is grounded to the bushing or to a suitable chassis.

Bushing and plugs of the known state of the art both have to be designed as that each will independently satisfy the electrical and mechanical requirements specified for that type of connectors.

SUMMARY OF THE INVENTION

The present invention relies on the fact that many plug connections on circuits of high-frequency technology are actuated only on very rare occasions. In many cases, plug connections are provided primarily for the purpose of simplifying the installation of the circuit. These plug connections are subsequently disconnected only once during its entire useful life, such as, for example when repairs are required. It is therefore an object of the present invention to provide an inexpensive but high quality plug and receptacle combination.

Another object of the invention is to provide a simple plug connection between an electronic circuit and one or several cables without impairing the electrical and mechanical functions as compared with prior art devices.

According to the invention, there is provided a plug element, on the cable side that is quasi-directly pushed into the PC board, and directly connected to the conducting paths on the carrier material without any intermediate link. The only additional function is to mount the plug element onto the housing. In this way, the structure of the plug connection is simplified to include only the component on the cable side, and no longer requires a person designing the housing to make provision for a suitable passage and a releasable lock. Based on this principle, the expenditure required for the connection point can be effectively reduced with different design variations adaptable to each given operating condition. Costs calculated for test designs amounted to only 25% of the cost for comparable arrangements of the state of the art.

A row of several cable connections to one circuit can be realized just as advantageously, for example, using a plug bar. The expenditure required heretofore for the special bushing construction is reduced to include only locking function as well. The space-saving structure, made possible by this principle, supports at the same time a single-side arrangement of all connections and an incoming and outgoing cable on a circuit housing preferred by user.

BRIEF DESCRIPTION OF THE DRAWINGS

Other objects and features of the present invention will become apparent from the following detailed description considered in connection with the accompanying drawings which disclose several embodiments of the invention. It should be understood, however, that the drawings are designed for the purpose of illustration only and not as a definition of the limits of the invention.

In the drawing, wherein similar reference characters denote similar elements throughout the several views:

FIG. 3*a* shows a bonded contact for contact with a computer line;

FIG. 3*b* shows a metal tongue for contact with a computer line;

FIG. 4 shows a plug connector with mechanical mounting having additional elements;

FIG. 5 shows a plug connector for connection to three slots on the printed circuit PC board;

FIG. 6*a* is an plug exploded view of a connector with outside conductor sleeve with circular bead;

FIG. 6*b* is a plug connection with a outside conductor sleeve having a hook;

FIG. 6*c* shows a plug connector arrangement with spring ring;

FIGS. 11*a* and 11*b* show plug connections for a slot on the circuit side, for two types of line such as for coaxial cable, and symmetrical line, and with different contact elements;

FIG. 11*c* shows a U-shaped strap with a bead;

FIG. 11*d* shows a U-shaped strap having a clamping effect;

FIG. 11*e* shows an H-type plug made of plastic, and a flat contact element;

DETAILED DESCRIPTION OF PREFERRED EMBODIMENTS

Figure 1A:
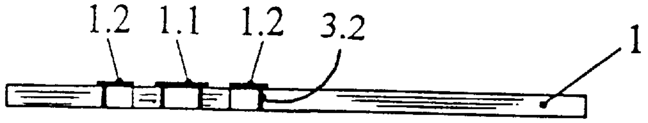
FIG. 1*a* shows a front end view of a plug connection according to the invention.
Figure 1B:
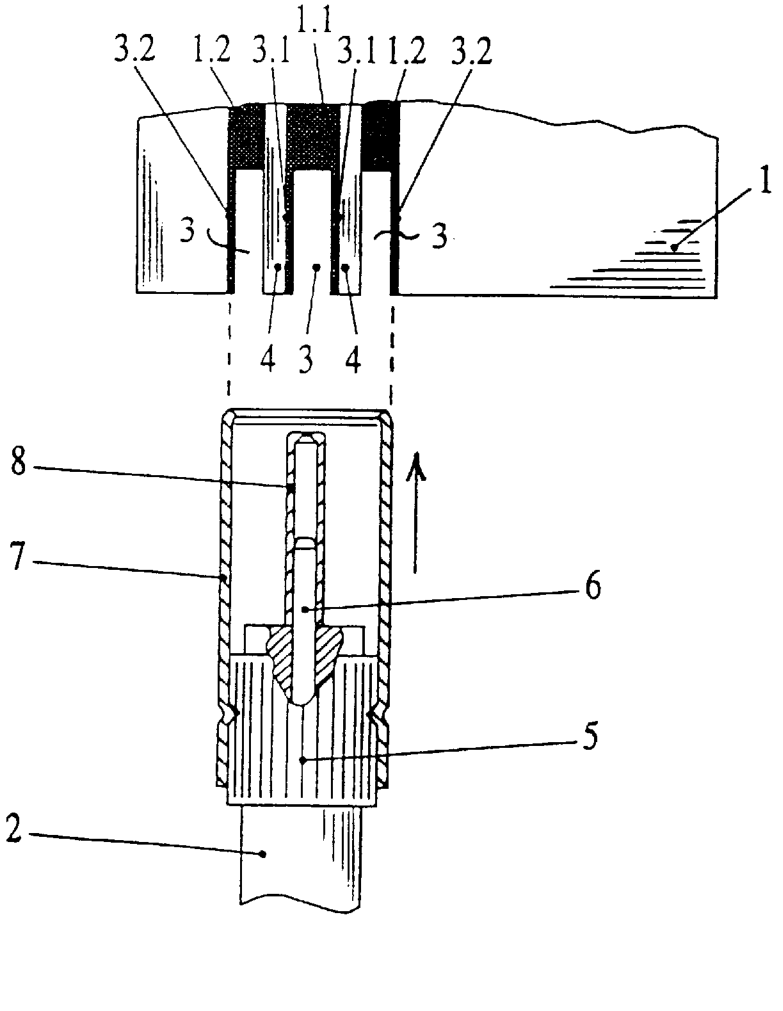
FIG. 1*b* shows an exploded view of a plug connection with three slots.
Figure 2A:
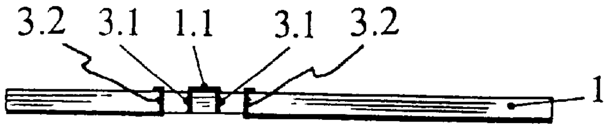
FIG. 2*a* shows a front end view of a plug connection of the invention.

Referring to FIGS. 1*a* and 1*b,* there are shown three slots 3 that are separated by tabs 4 and are produced in PC board 1 by milling or punching, and two slots 3 in the embodiment according to FIGS. 2*a* and *b*. Flanks or contacts 3.1, 3.2 of the slots are partly metal plated, and the metal conductors formed join different conducting paths 1.1, 1.2, or, with a ground surface on the opposite side of PC board 1.

The plug on the cable side consists of outside conductor sleeve 7, which is pushed over the outside conductor braid 5 of coax cable 2, and an inside conductor sleeve 8, which is pressed onto center conductor 6. As a variation according to FIG. 1, the inside conductor sleeve can also be designed in the form of a pin made of solid material.

In the operating condition, i.e., with the plug pushed in, center conductor sleeve 8 connects with conducting path 1.1 via contacts on both sides of center slot 3. Outside conductor sleeve 7 connects with conducting paths 1.2 via contacts 3.2, or the ground surface of the outside slots 3 on the other side of the PC board. Electrical contact can be assured by adapting the dimensions of the inside and center sleeves to match the spacing of the slotted tabs, so that they correspond with the spacing of sleeves, and by the spring action of the sleeve material. In this way, center sleeve 8 connects only to center contact 3.1, and outer sleeve 7 connects only to contacts 3.2.

Figure 2B:
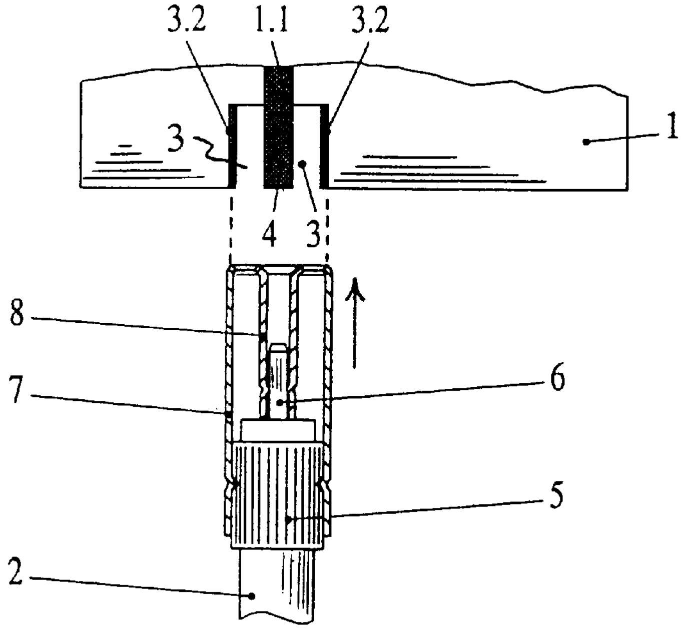
FIG. 2*b* shows an exploded view of a plug connection with two slots.

FIG. 3*a* and 3*b* show modifications of the slot design, wherein it is possible to comply with special circuit requirements. In FIG. 3*a,* contact projections which can be pointed or rounded off, one disposed on the inside edge of tabs 4 on board 1, cab be used to establish a defined contact with plug conductor sleeves 7 and 8. In FIG. 3*b,* the attached metal contacts 10, connected to board 1 by solder points 11, are particularly suitable for the plug of FIG. 2*b,* where the center contact is surrounded by the inside conductor of sleeve 8 and the outside contacts mate with sleeve 8. It is also possible to establish a contact with a ground conductor of a cable when a symmetrical cable is used. Such an arrangement is suitable also when several cables are connected having a plug receptacle bar.

FIG. 4 shows an example of how a plug connector according to the invention can be mechanically mounted on circuit housing 12. The opening of housing 12 is fitted on the outside with a mounting flange 14, which is engaged by levers 15 with hooks 30, which lock the plug connection to plug housing 13 in the operating position, and also permit the mounting to be easily released. In this embodiment, sleeve 7 fits inside slots 3 while center conductor 6 fits over contact 4.

In the following embodiments of the invention, plug housing 13 and holding flange 14 can be omitted without having to make cuts with respect to the quality of locking, and the mechanical mounting.

Figure 7:
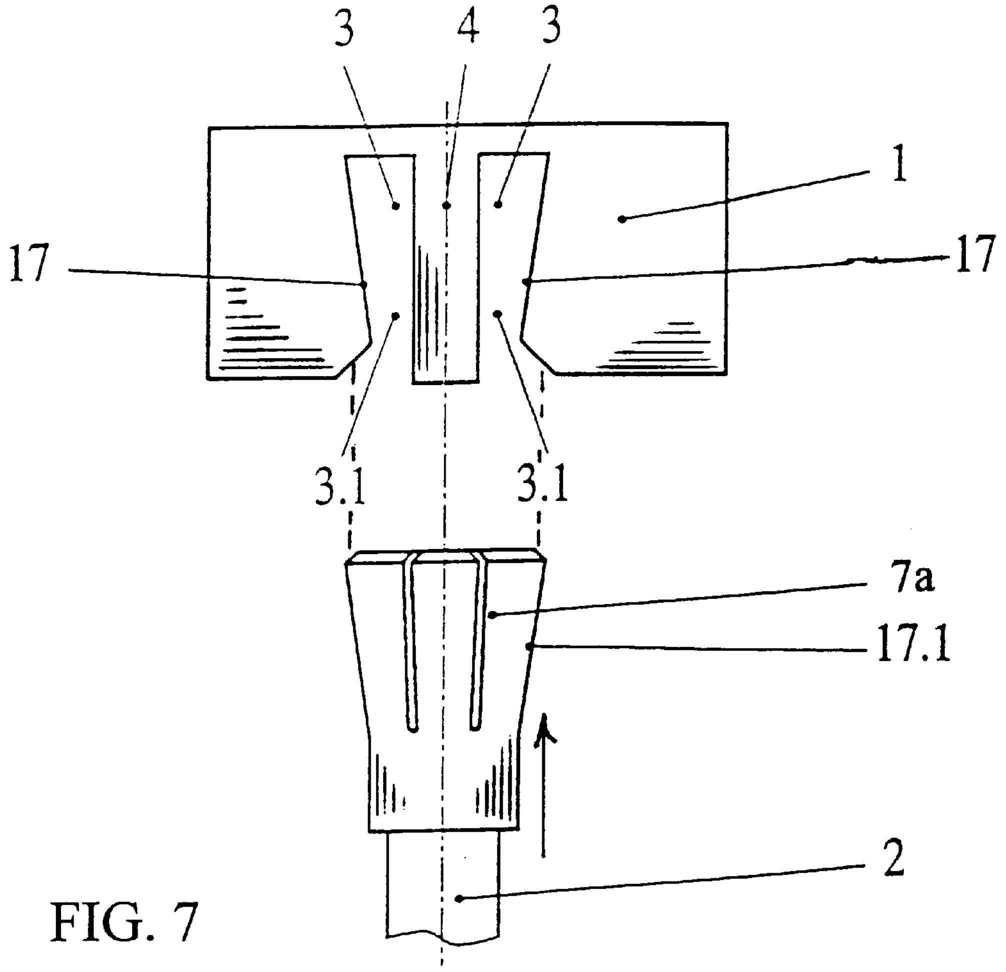
FIG. 7 shows a connection with bevelled slot flanks and a conical outside conductor sleeve for connection to a PC board.

The examples of FIGS. 5 to 7 show that the plug portion of the cable side can be mounted directly onto PC board 1. In addition, slots 3 on PC board 1 can be undercut or notched by notches in 16 as shown in FIGS. 5 or 6*a*. Moreover, in another embodiment, one or two outer tabs 3.2 can be provided with bevels 17, as shown in FIG. 7.

In FIGS. 6*a* and 6*b,* spring like elastic projections 16.1, are provided on the outside conductor sleeve 7, or center conductor sleeve 8 corresponding in each case with notches 16*b*. Moreover, in FIG. 7, a conical zone 17.1 can be designed on plug 7*a* to fit into bevel 17 of board 1. In this case, the desired mounting or holding effect is achieved without additional structural components or special moldings on the PC board housing. Projections 16 may be designed in the form of beads extending all around or as partial outward bulges, or in a hook-like way, etc., as shown in FIGS. 5 and 6. In this connection, projection 16.1 shown in FIG. 6*a* would be also suitable for an unreleasable connection if notch 16*b* on PC board 1 is designed with a mating shape.

The outside sleeve 7 provided with projections 16.1 and inside sleeve 8 are expected to slide into the slot arrangement without resistance when the parts are plugged together. This is assured by the elasticity of the sleeve material in association with the coaxial or spiral-like slots of the sleeve. The same effect is achieved with the variation according to FIG. 6*c,* wherein a spring ring 19 is disposed in annular groove 18.

Figure 8:
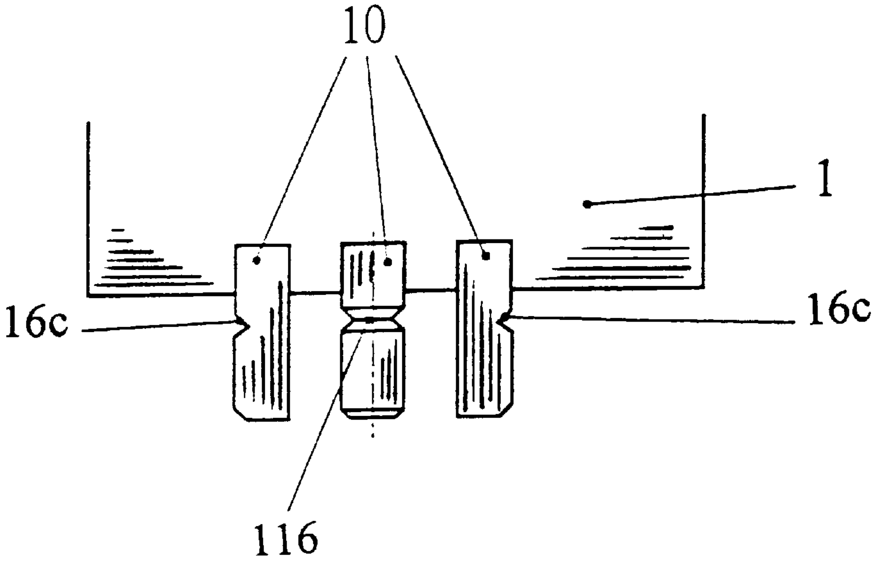
FIG. 8 shows the edge of a PC board with attached metal contacts.

FIG. 8 shows metal contacts 10 attached to board 1, wherein the outer contacts are flat and have a rectangular cross section. These contacts are provided with lateral undercuts or notches 16*c*. The center tongue could have a cylindrical cross section, and be provided with an annular groove or undercut 116.

Figure 9:
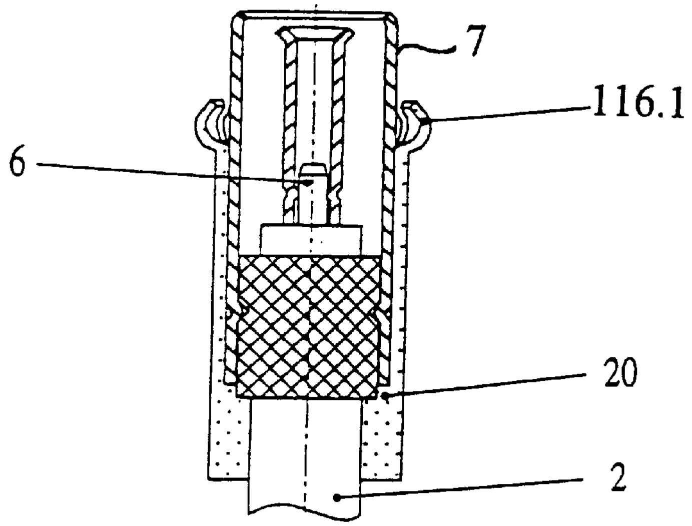
FIG. 9 shows a plug with a secondary sleeve.
Figure 10:
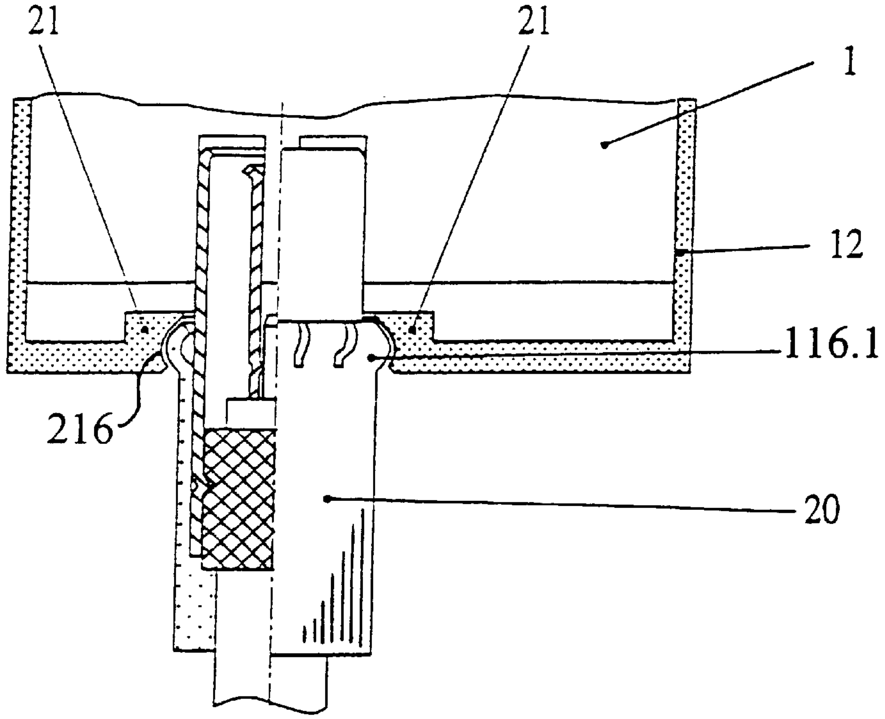
FIG. 10 shows a plug with a secondary sleeve, and mounted on a circuit housing.

In an additional embodiment of the invention, FIGS. 9 and 10 show a plug part with a secondary sleeve 20 which can be made of, plastic material. Sleeve 20 surrounds outer conductor sleeve 7, and can be locked with the plug part on the PC board, and also on the circuit housing as shown in FIG. 10, whereby projections 116.1 snap into a circular groove 216 formed in flange 21 of PC board 1.

In connection with the technology of spacial circuit carriers, a molded body having thin walls in most cases is manufactured from a carrier material, e.g., a housing for electrical components or a housing for a device itself, and the housing is provided on one side, on its inside surface, with conductor structures and fitted with components. In such cases, the conventional planar PC board is partly or wholly omitted.

When spatial circuit boards are used, the space conditions for line connections are less favorable in most cases, or different from those of PC boards enclosed by a housing.

Referring to FIGS. 11 to 14, there is shown a simplified embodiment of the invention, using contact elements in the plug part. Contact elements 7.1 and 8.1 shown in FIGS. 11*a* and 11*b,* each consist of a pin-like part with straps at both ends. One end of the straps in each case is crimped to a line-side conductor or cable conductor 5 and 6, respectively, and the other end is in contact with contact surface 1.3 and 1.4, respectively, on circuit board 1.0. The connection between the contact element and the line-side conductor component can be established by soldering, or crimped manner on by a hand tool. The connection point on the line is surrounded, for example by a rubber-elastic compound shown as molded part 22, made by injection molding or the like. Molded part 22 may, assume the mechanical functions for holding and arresting the plug connection, by cooperating with suitably mating design elements on circuit board 1.0, or on a housing.

Figure 12:
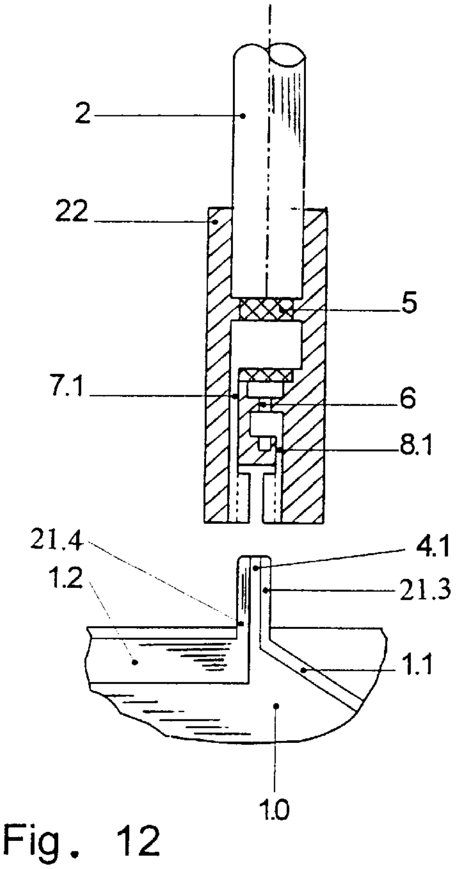
FIG. 12 shows a plug connection for a contact on the circuit side.

The contact elements 7.1 and 8.1 are electrically coupled to contact surfaces 1.3 and 1.4, and held in place by force-locking circuit board 1.0. There are two ways to lock these contacts together. First, the circuit-side strap of the contact element is either bent, for example U-shaped, gripping around a contact of slot 3, or a tab 4.1 on the circuit board as shown in FIG. 12. Second, molded part 22 is additionally designed as a spring and arresting element 22.1 enclosing the contact zone of the plug connection. In this case, the strap may be designed, for example, in the form of a simple flat strap 22.2 as shown in FIG. 11*e*.

The embodiments according to FIGS. 11*a* and 11*b* differ from each other in two ways. First, the type of line involved, either coax cable or twin lead, is different. Moreover, in FIG. 11*a,* the position of the contact elements is laterally stabilized by using adequately rigid rod-like sections for contact elements 7.1 and 8.1. In the second embodiment of FIG. 11*b,* a molded body 22 extends into the slot zone, and serves as a spring-like zone 22.1 to swing outwardly contacts 7.1 and 8.1 into contacts 11.1 and 11.2.

Other possible circuit contact designs of contact elements 7.1 and 8.1 are shown in FIGS. 11*c,* 11*d* and 11*e*. In these designs, it is necessary to have a spring effect, which gives a close contact, but provides a non-positive locking between the surfaces to be contacted. In addition, the design must insure that the connection is durable and secure against any shock and vibration.

Figure 13:
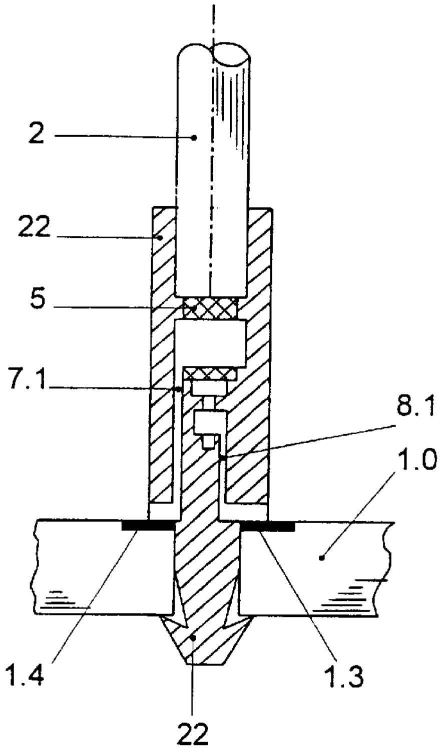
FIG. 13 shows a plug connection to a circuit board that is perpendicular to the surface of the circuit board.

Other functional variations of the embodiments of FIGS. 11*a* and 11*b* shown in the examples according to FIGS. 12 to 14. Here, the FIGS. 13 and 14 show a perpendicular plug connection for spatial circuit boards. It is clear from the figures that the individual design features are interchangeable.

For example, the plug connection according to FIG. 12 showing a design with projecting tongue 4.1 can be conceived as a perpendicular connection. This connection can be achieved by replacing the contact on the circuit side with a lug disposed in the plane of the circuit, and fitted with separate contact paths 21.3 and 21.4. Likewise, a variation according to FIG. 14*b* is shown with contact surfaces 11.3 and 11.4, disposed on an inner wall of circuit board 1.0, using the right angle connector according to FIG. 13, and both variations are advantageously applicable in this form with devices where the circuit is intended to be on the inside on the wall in 3D-technology.

Figure 14A:
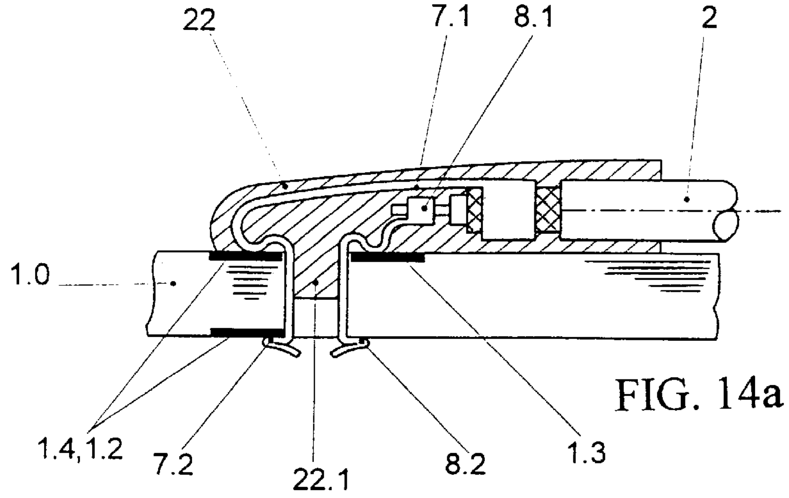
FIGS. 14*a* and 14*b* show an angle plug connector having its axis line parallel with the surface of the circuit board, wherein the circuit contact surfaces are on the plug side or on the opposite side.
Figure 14B:
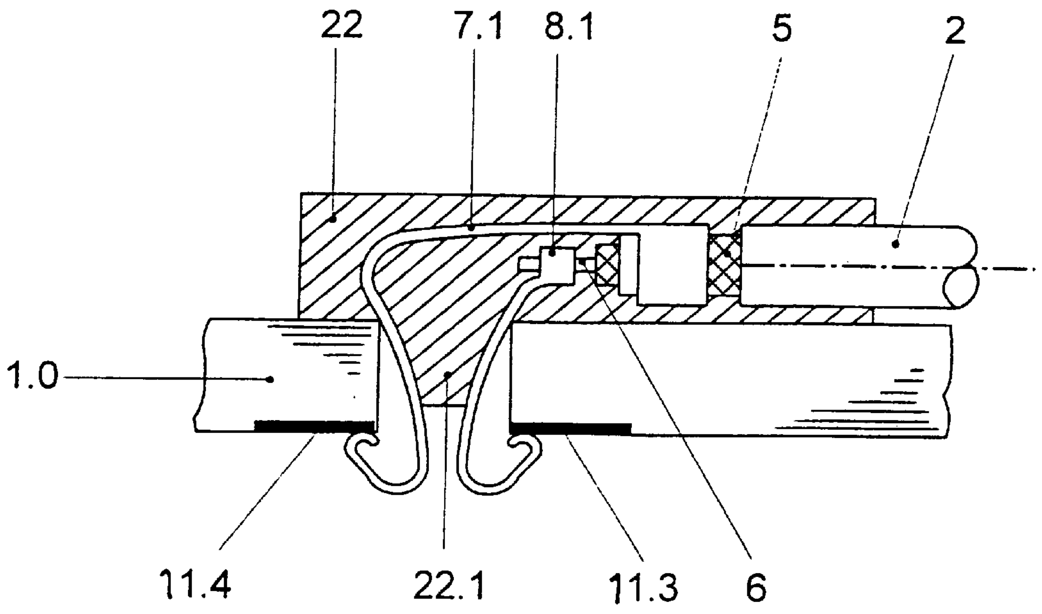

Finally, the circuit-side strap of contact element 7.1 and 8.1 can be used for electrically connecting the conducting paths of circuit boards printed on both sides, as shown in FIG. 14*a*. For example, an electrical connection can be produced without requiring a plated through hole in the circuit board, using the spring-like contacts 7.2 and 8.2 formed at the end of contact elements 7.1 and 8.1, and spring apart by elastic element 22.1.

These last examples make it clear that the invention provides a great variety of different designs with any desired degree of ease. The principle underlying the invention is realizable in the majority of applications, allowing solutions with lower expenditure in both engineering time and cost versus the known state of the art devices.

Based on the variations in FIGS. 11 to 14, a plug connection with contacts for both the signal path and for the ground connection, is possible using only a slot or a contact on the PC board, or on the housing part of a circuit. This renders the structure of plug part to be a simple design, which provides for further material savings and reduction of the space requirements. Furthermore, the design shows an uncomplicated way for obtaining plug connections with unilaterally "printed" circuits. Thus, it is no longer necessary to plate or copper clad with metal the sides of the slot or the contact, to connect the latter to the conducting paths of the circuit.

The plug connector can be made with low expenditure using a connection having recesses in the PC board material, that is shaped in any desired way, which, therefore, can be encoded as well. Simple "button-in" solutions are feasible. These have benefits in that they become effective especially with spatially disposed circuit boards.

Lastly, these embodiments of the invention can also be favorably realized as angular plug arrangements in many variations.

While several embodiments of the present invention have been shown and described, it is to be understood that many changes and modifications may be made thereunto without departing from the spirit and scope of the invention as defined in the appended claims.

What is claimed is:

1. A line plug connection for transmitting electrical energy between a cable having a ground conductor and a center conductor, and a printed circuit board comprising:

a cable plug having an external conductive sleeve for connection to the ground conductor of the cable, and a center conductive sleeve for connection to the center conductor of the cable and wherein said external conductive sleeve includes an elastic projection;

at least one elongated tongue formed by at least two slots on a peripheral edge of the circuit board;

at least two different metal contacts formed over a portion of said circuit board adjacent to said slots, wherein the spacing of said slots and the width of said at least one tongue correspond with the width of the cable plug sleeves so that when said cable plug and its sleeves are pushed into said slots, said external conductive sleeve is in frictional connection with one of said metal contacts on said circuit board, and said center conductive sleeve is connected to another one of said metal contacts on said circuit board; and said at least one slot includes a notch and wherein the elastic projection corresponds to said notch found in the slot so that when the cable plug is pushed into the slots, the elastic projection engages and expands into said notch effecting an arrest of said cable plug.

2. The line plug connection of claim 1, wherein said notch comprises a bevel formed in said slots and the external conductive sleeve of said cable plug has a conical cross section to fit into said bevel.

3. The line plug connection according to claim 2, wherein the external conductive sleeve comprises a circular groove, and a radial elastic ring inserted in said circular groove, said ring corresponding with said notches in said slots when the cable plug part is pushed into the slots of the circuit board.

4. The line plug connection according to claim 3, comprising a secondary sleeve enclosing said external conductive sleeve and being connected thereto, said secondary sleeve having elastic projections on its periphery effecting a mounting with the notch slots of the circuit board.

5. The line plug connection according to claim 4, wherein said radial elastic ring and said secondary sleeve may be made of metal.

6. The line plug connection according to claim 4, wherein said radial elastic ring and said secondary sleeve may be made of a plastic material.

7. The line plug connection according to claim 3, comprising a housing for holding the circuit board, and wherein said housing includes a flanged opening, wherein the external conductor sleeve and said secondary sleeve enclosing the external conductor sleeve engage said circular groove in the flanged opening of said housing.

* * * * *